United States Patent [19]

Sorenson et al.

[11] Patent Number: 5,652,506

[45] Date of Patent: Jul. 29, 1997

[54] APPARATUS FOR MEASURING AN A.C. CURRENT IN A CABLE

[76] Inventors: Thomas Sorenson, Darien, Annacotty, County Limerick; Michael McCormack, 29 Farnog, Shannon, County Clare; Francis Keane, 36 Ashbrook Crescent, Limerick; Eugene O'Doherty, 11 Heatherdale, Monaleen, Limerick, all of Ireland

[21] Appl. No.: 653,367

[22] Filed: Jun. 10, 1996

[30] Foreign Application Priority Data

Mar. 1, 1996 [IE] Ireland ................................. S690198

[51] Int. Cl.⁶ .................................................. G01R 1/22
[52] U.S. Cl. ................... 324/117 R; 324/127; 343/702; 340/870.17; 33/464; 33/472
[58] Field of Search ..................... 324/127, 126, 324/140, 142, 117 R; 343/702; 33/464, 465

[56] References Cited

U.S. PATENT DOCUMENTS 4,827,272  5/1989  Davis ........................................ 343/702

*Primary Examiner*—Kenneth A. Wieder
*Assistant Examiner*—Barry C. Bowser
*Attorney, Agent, or Firm*—Van Dyke, Gardner, Linn & Burkhart, LLP

[57] ABSTRACT

An apparatus for measuring an a.c. current flowing in an electric cable comprises a pair of jaws for receiving the cable and which are movable towards one another to engage the opposite sides of the cable. A potentiometer generates a signal ("cable size signal") corresponding to the relative positions of the jaws. A set of coils is provided adjacent the jaws to detect the magnetic field generated by current flowing in the cable. A circuit in the housing is responsive to the cable size signal and the voltage induced in the coil for determining the amplitude of the current flowing in the cable and displaying the same on a display.

16 Claims, 9 Drawing Sheets

५,६५२,५०६

APPARATUS FOR MEASURING AN A.C. CURRENT IN A CABLE

FIELD OF THE INVENTION

This invention relates to an apparatus for measuring an alternating current flowing in an electric cable, for example an a.c. mains cable.

BACKGROUND TO THE INVENTION

Amperes Law states that the integral of the magnetic field around a closed loop surrounding a current source is equal to the current enclosed. This is the principle used in conventional one wire current probes and the method of measurement is shown in FIG. 1.

A magnetic material 10 completely surrounds a current carrying wire 12 and a coil 14 having a large number of turns of wire is wound uniformly on the magnetic material 10. The voltage induced in the coil 14 is directly proportional to the current I flowing in the wire 12 that the magnetic material 10 encloses.

This type of probe has the advantage that any other current carrying wire outside the probe induces no voltage in it and a relatively large voltage is induced in it from the single current carrying wire it surrounds.

However, it cannot readily be used to measure current in cables that have more than one current carrying wire, for example, a two or three wire cable, as the current that flows out in one wire returns in the other(s) and so the current enclosed is zero and no voltage will be induced in the coil 14. This would entail removing the outer layer of the cable so that an individual wire can be separated sufficiently to place the probe around it. In the vast majority of single phase wiring, however, two or three wire cables are used with no ready access to a single wire.

It is an object of the apparatus to provide an apparatus for measuring the current flowing in an electric cable where the cable has more than one current-carrying wire, for example oval or round cables having two wires or two wires and earth, and where currents nominally of equal amplitude flow in opposite directions along the cable.

SUMMARY OF THE INVENTION

According to a first aspect the present invention provides an apparatus for measuring an a.c. current flowing in an electric cable, the apparatus comprising cable receiving means having relatively movable cable contacting elements which are adjustable to engage the periphery of the cable, means for generating a signal ("cable size signal") corresponding to the relative positions of the cable contacting elements, at least one coil to detect the magnetic field generated by current flowing in the cable, and circuit means responsive to the cable size signal and the voltage induced in the coil for determining the amplitude of the current flowing in the cable.

According to a second aspect the present invention provides a method for measuring an a.c. current flowing in an electric cable having two wires carrying go and return currents of nominally equal amplitude, comprising locating first and second coils close together adjacent the cable, the first and second coils having substantially orthogonal axes, and determining the amplitude of the current flowing in the cable from the voltages induced in the first and second coils.

According to a third aspect the present invention provides a method for measuring an a.c. current flowing in an electric cable having two wires carrying go and return currents of nominally equal amplitude, comprising locating a first coil adjacent the cable, locating a second coil adjacent the first coil on the opposite side of the first coil to the cable, the first and second coils having substantially parallel axes, forming a signal ("difference signal") related to the difference between the voltages induced in the first and second coils, and determining the amplitude of the current flowing in the cable from the difference signal.

In this specification the axis of a coil means that direction relative to the coil which, when orientated parallel to the lines of force of a fluctuating magnetic field passing through the coil, would provide the maximum induced voltage in the coil for that magnetic field.

BRIEF DESCRIPTION OF THE DRAWINGS

Embodiments of the invention will now be described, by way of example, in which.

DETAILED DESCRIPTION OF THE PREFERRED EMBODIMENT

Figure 1:
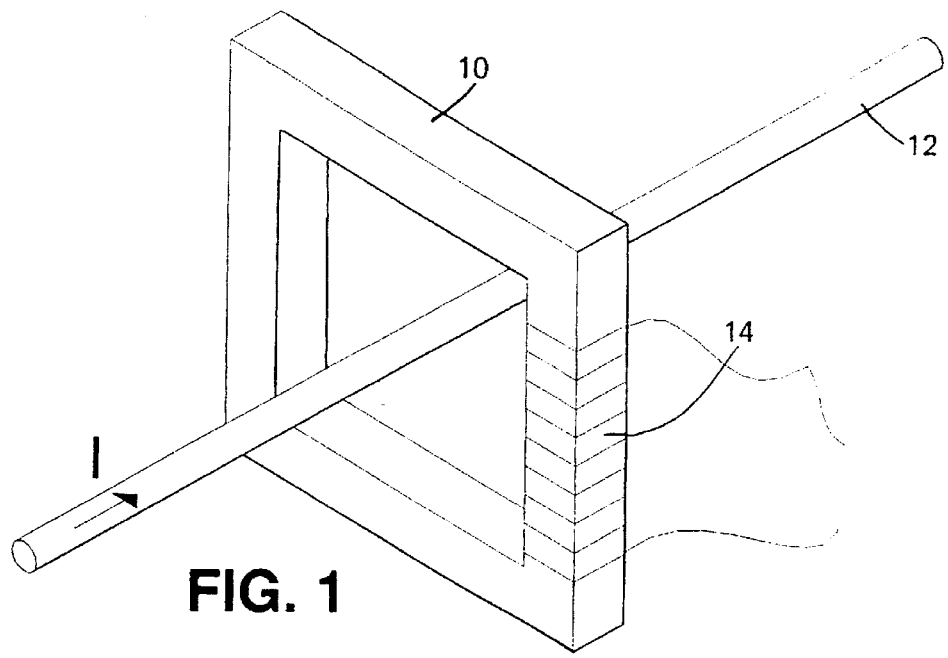
FIG. 1, previously described, illustrates a prior art technique of current measurement in one wire cables.
Figure 2:
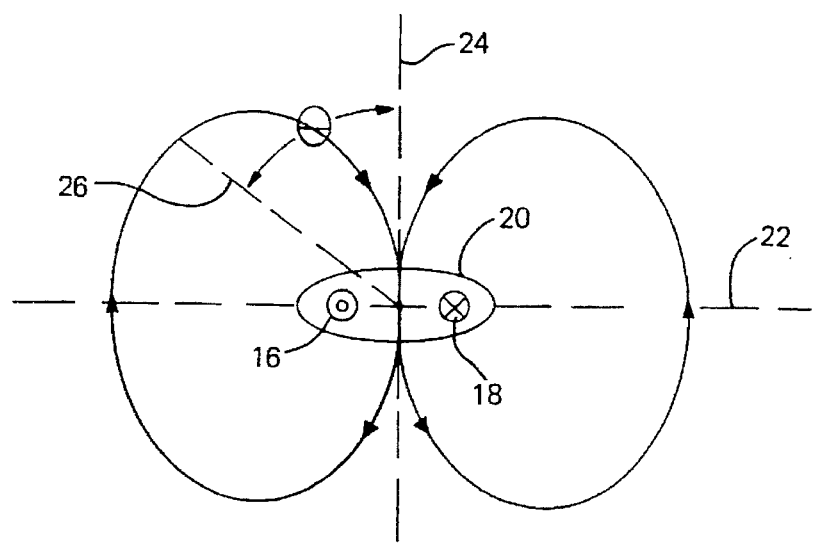
FIG. 2 illustrates the magnetic field around a pair of wires carrying equal amplitude currents flowing in opposite directions.

Referring to the drawings, FIG. 2 shows the magnetic field lines in a plane normal to the two wires 16 and 18 of a two-wire flat or (as shown) oval mains cable 20 with a current I flowing out in one wire 16 and returning in the other wire 18 (substantially the same field will occur for the current-carrying conductors of two-wire and earth cables, since normally the earth wire will not carry current).

It is apparent that at points on the major axis of the wires (i.e. the notional straight line 22 passing through the centres of the two wires) the magnetic field is perpendicular to the major axis 22 and in the same direction at both sides of the cable 20, whereas at points along the minor axis of the wires (i.e. the notional straight line 24 passing midway between two wires and normal to the major axis 22) the magnetic field is parallel to the minor axis 24. However, at points such as the point P which is neither on the major axis or the minor axis, the direction of the magnetic field will be a function of the angle them between the minor axis 24 and the notional line 26 joining the point P to the origin O, which is the point midway between the two wires where the major and minor axes intersect. The magnitude |H| of the magnetic field at any such point P may be derived as follows.

Figure 3:
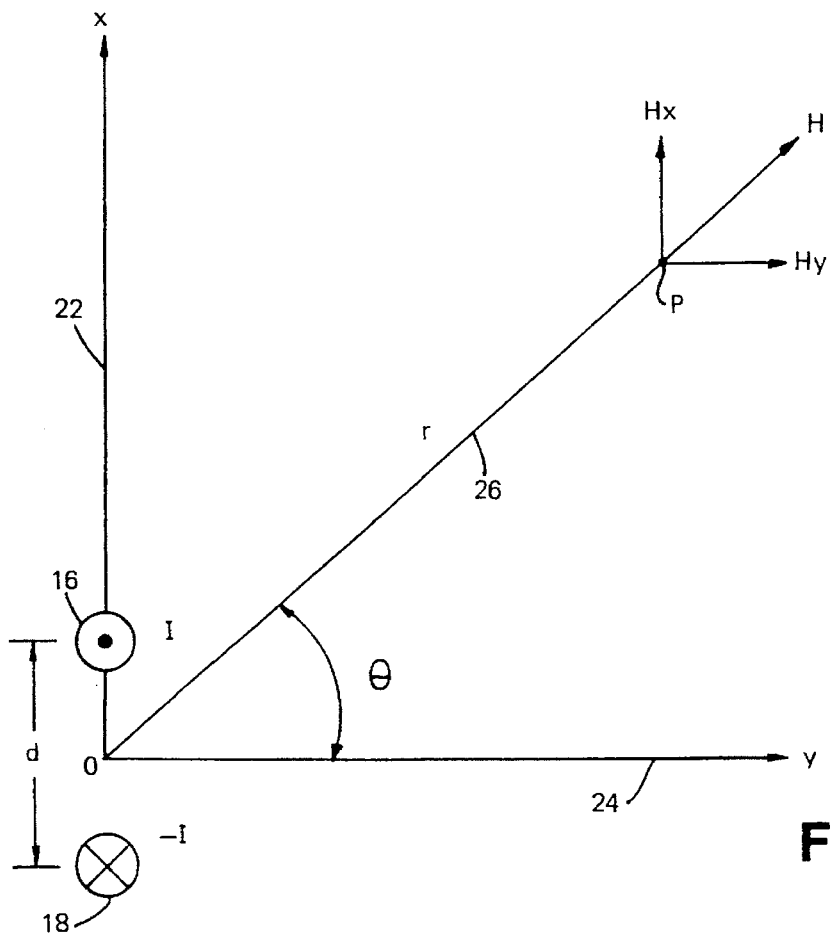
FIG. 3 is a coordinate system showing the components of magnetic field parallel to perpendicular axes.

In FIG. 3, rectangular and polar coordinate systems have been established with their origin at O midway between the two wires. The x- and y-axes of the rectangular coordinate system are along the major and minor axes 22 and 24 respectively.

It can be shown that the x and y components of the magnetic field, i.e. Hx and Hy, are given by:

$$H_x = \frac{2Idr^2\cos\theta\sin\theta}{2\pi\left\{\left(r^2+\frac{d^2}{4}\right)^2 - d^2r^2\sin^2\theta\right\}} \quad (1)$$

$$H_y = \frac{I}{2\pi} \frac{\left\{r^2d(2\sin^2\theta - 1) - \frac{d^3}{4}\right\}}{\left\{\left(r^2+\frac{d^2}{4}\right)^2 - d^2r^2\sin^2\theta\right\}} \quad (2)$$

The magnitude |H| of the magnetic field may be derived from:

$$|H| = \sqrt{H_x^2 + H_y^2} \quad (3)$$

and the result is:

$$|H| = \frac{Id\sqrt{1 - \frac{d^2}{2r^2}(2\sin^2\theta - 1) + \left(\frac{d^2}{4r^2}\right)^2}}{2\pi\left\{\left(r^2+\frac{d^2}{4r}\right)^2 - d^2r^2\sin^2\theta\right\}} \quad (4)$$

It is found that |H| is a maximum when the m=90 degrees and is given by:

$$|H|_{max} = \frac{Id}{2\pi r^2\left(1 - \frac{d^2}{4r^2}\right)} \quad (5)$$

and is a minimum when the m=0 degrees and is given by:

$$|H|_{min} = \frac{Id}{2\pi r^2\left(1 + \frac{d^2}{4r^2}\right)} \quad (6)$$

However, if the distance r of the point P from the origin O is substantially greater than the distance d between the two wires 16 and 18, the bracketed expression in both equations 5 and 6 becomes close to one. Thus, as one moves the point P around the origin O at a constant distance r, the magnitude |H| of the magnetic field may be assumed to be a constant value given by:

$$|H| = \frac{Id}{2\pi r^2} \quad (7)$$

For example, for r greater than or equal to 3d, the actual value of |H| will vary by less than plus or minimum 3% from the value given by equation 7 as the point P moves around the origin.

Thus, for r substantially greater than d, the magnitude |H| of the magnetic field is proportional to the amplitude of the current I and the spacing d between the wires 16 and 18 and is inversely proportional to r squared. Accordingly, if d and r are known, the current I can be calculated from the magnitude |H| of the magnetic field.

Where the orientation of the two wires is known, such as in the case of a flat or oval cable, then the direction of the magnetic field is known and a single coil can be used to determine |H|. An arrangement for doing this is shown in FIG. 4.

Figure 4:
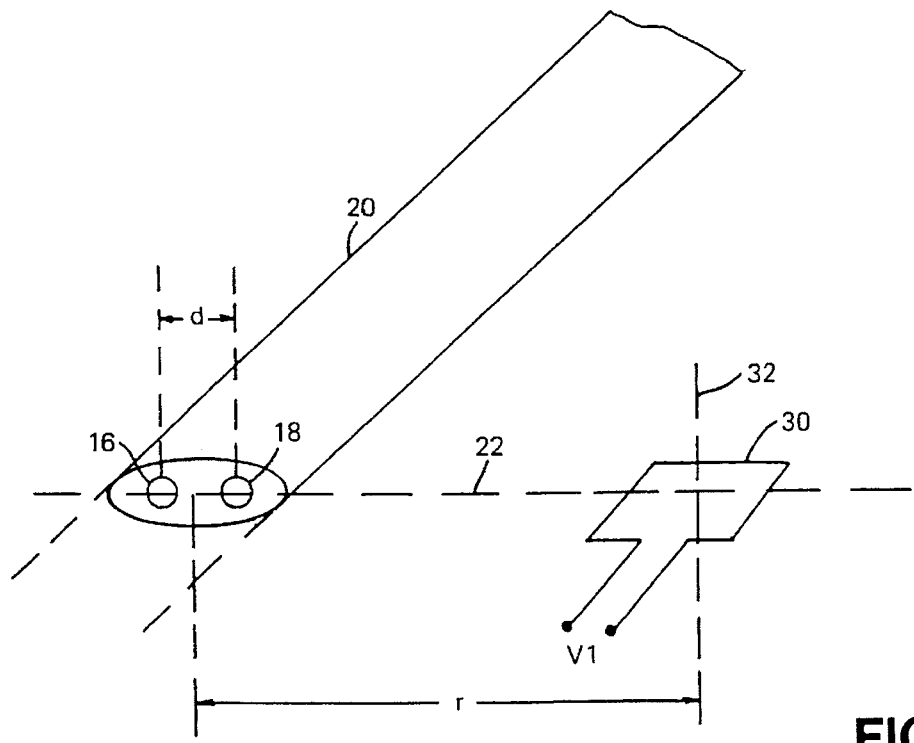
FIGS. 4 to 7 show various arrangements for determining the current flowing in a two-wire flat or oval cable.

In FIG. 4 a single coil 30 is located on the major axis 22 of the cable 20. Since it is known (FIG. 2) that on the major axis 22 the lines of force of the magnetic field generated by the wires 16 and 18 are normal to the major axis 22 and in a plane normal to the cable 20, the axis 32 of the coil 30 is likewise orientated substantially normal to the major axis 22 and in a plane substantially normal to the cable 20 so as to be aligned parallel to the lines of magnetic force and thereby provide maximum coupling of the magnetic field with the coil. In other words, the coil axis 32 is aligned parallel to the y-axis (FIG. 3) since on the major axis 22 of the cable there is no x-component of the magnetic field.

The axis 32 of the coil is a known distance r from the midpoint between the wires 16 and 18. In order to mice advantage of the approximation afforded by equation 7, r is preferably substantially greater than, and most preferably at least three times, the distance d between the wires 16 and 18 (the distance d is known for different standard cable sizes and types and can be determined from manufacturers' published specifications).

The voltage V1 induced in the coil 30 will be proportional to the magnitude |H| of the magnetic field and the number of ampere-turns of the coil (for simplicity the coil 30 is represented in FIG. 4 as a simple square, although in actuality the coil 30 will consist of multiple turns of wire to provide a relatively large induced voltage). Since the magnitude |H| is itself proportional to the current I in the cable 20 (equation 7), the current I can be derived by simple calculation from the induced voltage together with the known values of r and d. The induced voltage V1 is therefore amplified in an amplifier which is tuned to the mains frequency in question (to minimise noise effects) and this amplified voltage may be analog to digital converted and used to determine the current I.

A disadvantage with the use of a single coil 30 to determine the cable current I is that it will also pick up the magnetic field from other current sources in its vicinity. The effect of current in adjacent cables may be reduced by placing a second coil 34 (FIG. 5) on the major axis 22 of the cable 20. This coil 34 is located on the opposite side of the coil 30 to the cable 20, and has substantially the same number of ampere-turns as the coil 30 and has its axis 36 aligned substantially parallel to the axis 32 of the coil 30. The coils 30 and 34 are connected in series in phase opposition, so that the output voltage of the series connected coils supplied to the tuned amplifier is the difference (V1−V2) between the individual voltages V1 and V2 induced in the coils 30 and 34.

Since the coil 30 is closer to the cable 20 than is the coil 34, the voltage induced in the coil 30 by the current in the cable 20 will be greater than the voltage induced in the coil 34 by the current in the cable 20, because the magnetic field falls off with distance by a factor $1/r^2$ from the cable (equation 7). Thus, when the voltages V1 and V2 induced in the coils 30 and 34 are subtracted (by the coils being connected in phase opposition) the voltage induced in the coil 34 by the current in the cable 20 will only cancel a portion of the voltage induced in the coil 30 by the current in the cable 20. However, for an interfering current source which is some way away, the voltages induced in the coils 30 and 34 by the remote current source will be almost the same and so when the voltages V1 and V2 are subtracted the voltages induced by the remote current source will substantially cancel.

For example, for coil 30 a distance of 1 cm from the centre of the cable 20 and coil 34 a distance of 2 cm from the same centre, the voltage induced in the coil 34 by the cable 20 will be only ¼ that induced in the coil 30 by the cable 20, so that upon subtraction of V2 from V1 there still remains ¾ of the voltage induced in the coil 34 by the cable 20.

However, for an interfering cable of the same type and carrying the same current as the cable 20 and which is located 10 cm away from the coil 30, the voltage induced in coil 30 is only about 1/100th of that induced by the cable 20 itself, and this is further reduced when V1 and V2 are subtracted so that only about 1/500th of the difference voltage (V1–V2) can be attributed to the interfering source.

Figure 5:
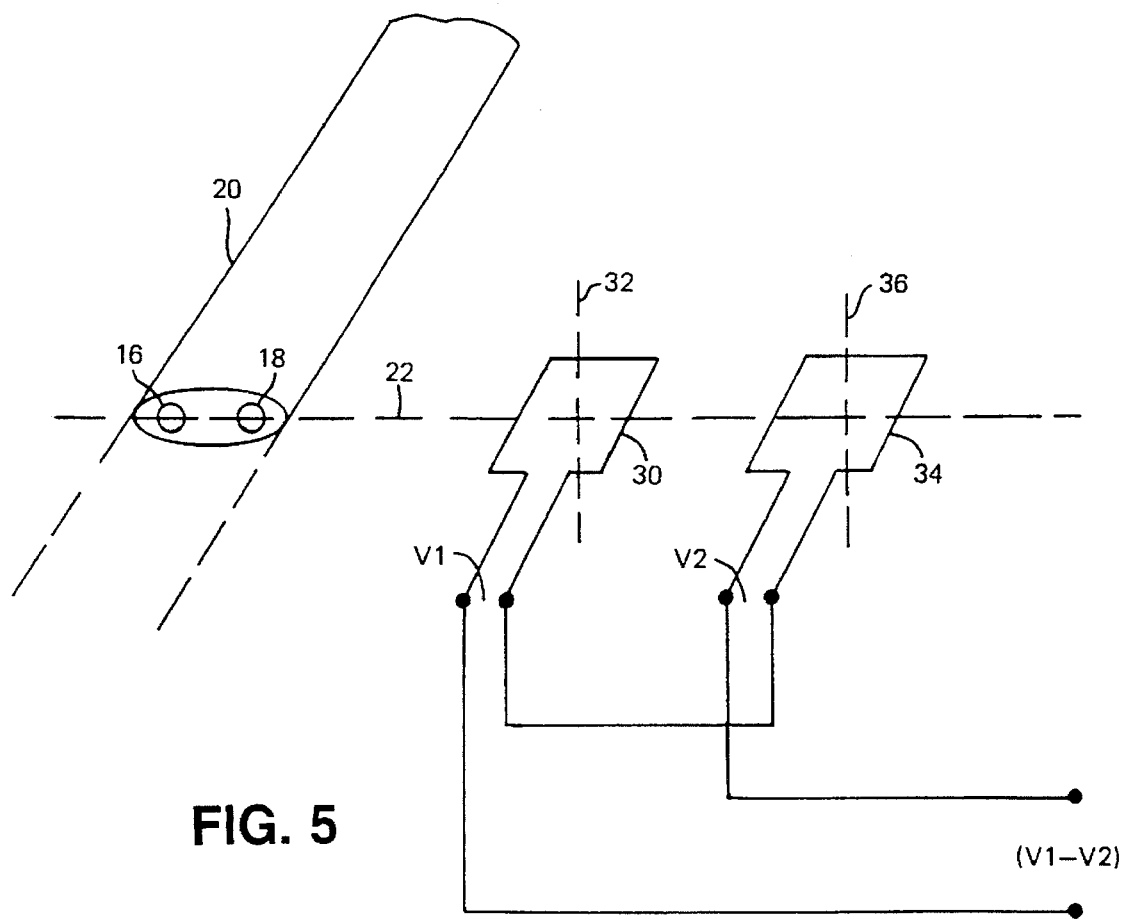

In each of FIGS. 4 and 5, the sensitivity of the arrangement may be doubled by providing a duplicate coil arrangement on the diametrically opposite side of the cable 20.

Figure 6:
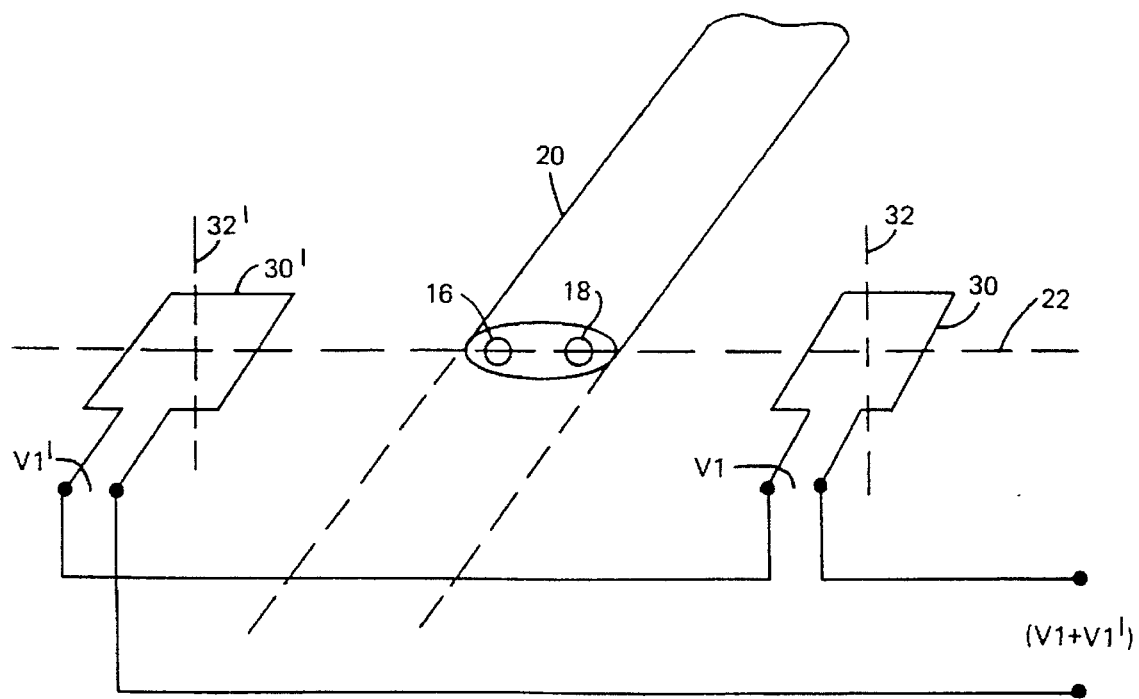

Thus, in FIG. 6, which is a development of FIG. 4, a second coil 30' has been located on the major axis 22 of the cable 20 on the opposite side to the coil 30 and at the same distance r from the cable 20 as the coil 30. The coil 30' has substantially the same number of ampere-turns as the coil 30 and the axis 32' of the coil 30' is substantially parallel to the axis 32 of the coil 30. The coils 30 and 30' are connected in series in the same phase, so that the individual voltages V1 and V1' induced into them by the cable 20 are added together to produce a net output (V1+V1') to the tuned amplifier.

Figure 7:
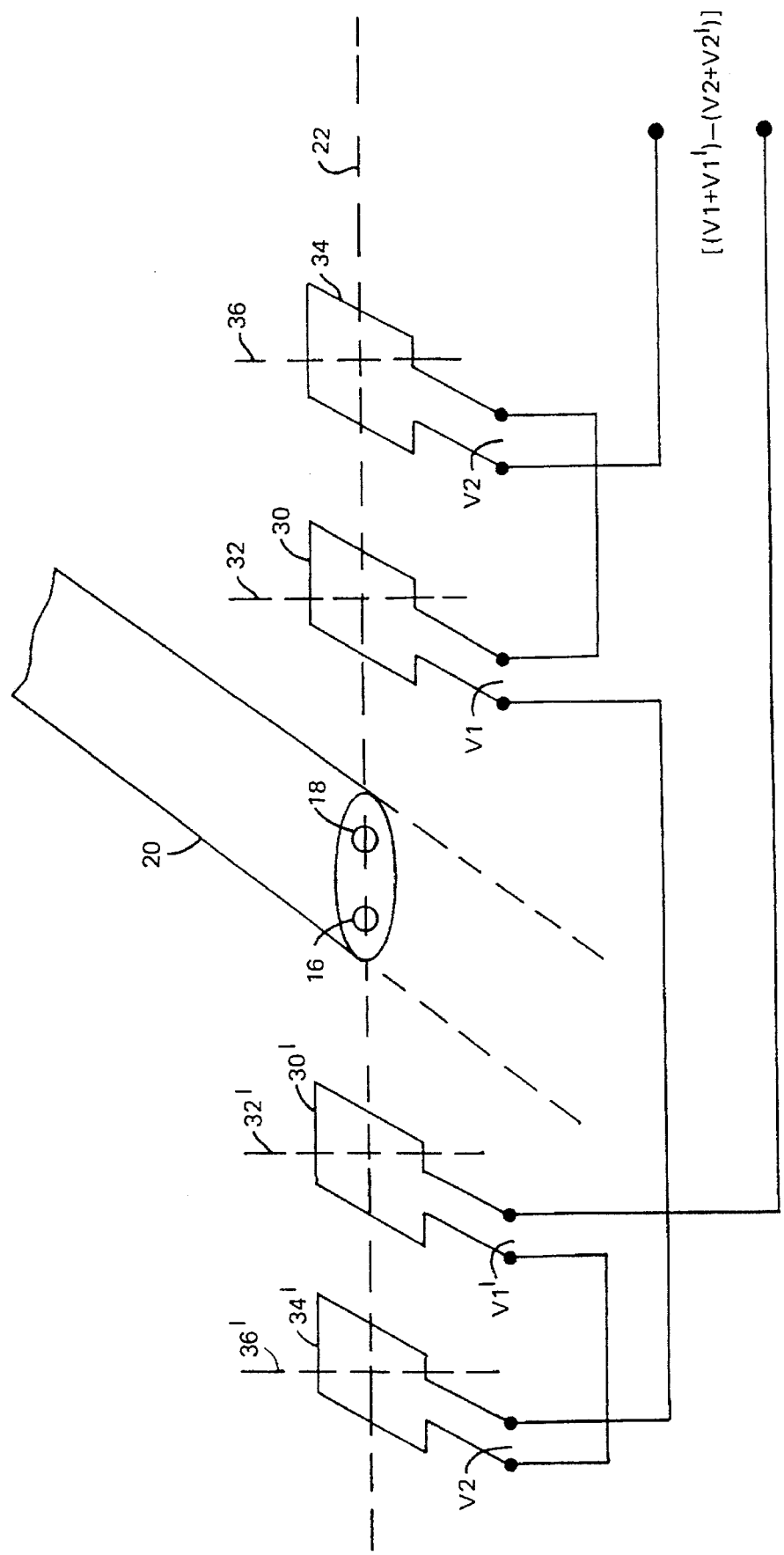

Similarly, in FIG. 7, which is a development of FIG. 5, both coils 30 and 34 have been duplicated on the opposite side of the cable 20. All four coils 30, 34, 30' and 34' have substantially the same number of ampere-turns and their axes are substantially parallel. The coil 30' is at the same distance from the cable 20 as the coil 30 and the coil 34' is at the same distance from the cable 20 as the coil 34. In this case all four coils are connected in series, with coils 30 and 30' connected in the same phase and coils 34 and 34' also connected in the same phase but in phase opposition to the coils 30 and 30'. Thus the net output to the tuned amplifier is [(V1+V1')–(V2+V2')].

Heretofore we have dealt with the case of flat or oval cables in which the orientation of the wires, and hence the major axis 22, can be deduced from the exterior appearance of the cable. However, in the case of round cables the orientation of the pair of current carrying wires 16, 18 is unknown and so at any given point P the direction of the magnetic field is unknown.

It has been shown (equation 7) that, provided the distance r of the point P from the mid-point between the wires 16, 18 is substantially greater than the distance d between the wires the total magnetic field is a constant related to the current I even though the direction changes as we move around the pair of wires. It is therefore necessary, in the case of round cables, to determine separately the magnitude of the x and y components Hx, Hy of the magnetic field and perform the operation shown in equation 3 to determine the magnitude |H| of the magnetic field.

Figure 8:
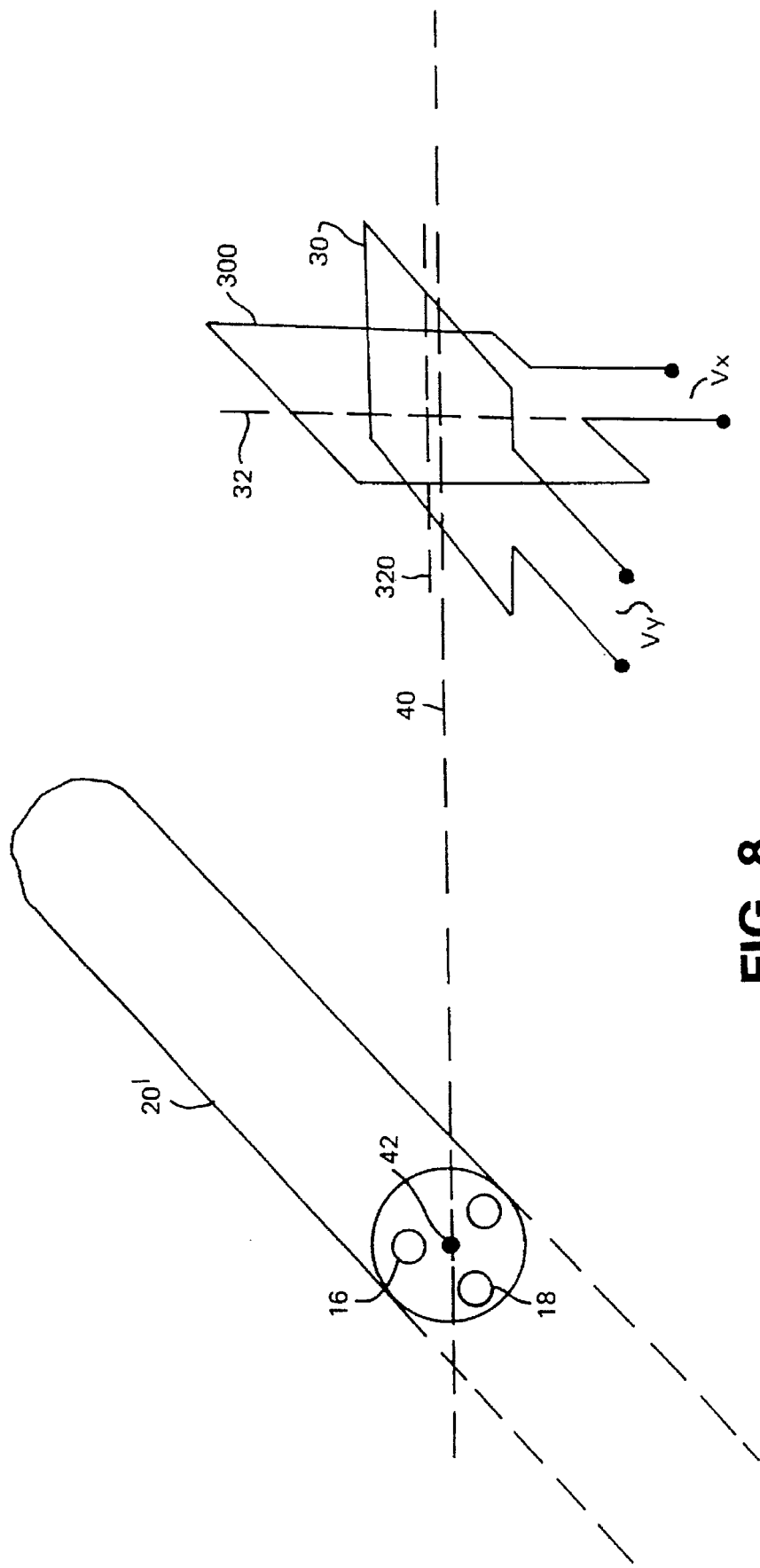
FIG. 8 shows arrangement for determining the current flowing in a round cable.

Thus, in FIG. 8, which is a development of FIG. 4, a further coil 300 is located close to the coil 30. As before, the axis 32 of the coil 30 is located in a plane normal to the round cable 20' and substantially perpendicular to a notional straight line 40 passing through the centre 42 of the cable 20' and the coil 30 (in this case we cannot refer to major and minor axes as we have no knowledge of the orientation of the current-carrying wires 16, 18). As before, the distance from the axis 32 of the coil 30 to the centre 42 of the cable 20' is at least three times the distance between the wires 16 and 18 (the fact that the point 42 is not exactly between the wires 16 and 18 does not make a significant difference to equation 7).

The coil 300 has substantially the same number of ampere turns as the coil 30 and is located at substantially the same distance from the cable 20' as the coil 30 and at substantially the same angular position around the cable 20' as the coil 30. Like the axis 32 of the coil 30, the axis 320 of the coil 300 is also located in a plane normal to the cable 20' but is substantially orthogonal to the axis of the coil 30 (i.e. it lies substantially along or closely parallel to the notional line 40).

The voltages Vx and Vy induced in the coils 300 and 30 respectively are proportional to the magnitudes of the x and y components of the magnetic field produced by the wires 16, 18 in the cable 20', and are supplied to substantially identical tuned amplifiers. The outputs of the amplifiers can be analog to digital converted and processed to perform the operation:

$$V=(Vx^2+Vy^2)^{0.5} \qquad (8)$$

and V is directly proportional to the current I in the cable 20'.

As noted above, not only does the coil 300 have to be located at substantially the same distance from the cable 20' as the coil 30 and at substantially the same angular position around the cable 20' as the coil 30, but it also has to be close to the coil 20'. This is due to the fact that in round cables the orientation of the two current carrying wires 16, 18 changes as one moves along the cable in a spiralling fashion. It is therefore not possible to place the orthogonal coil 300 alongside the original coil 30 a little further along the length of the cable as the orientation of the magnetic field will have changed. It is therefore necessary that both coils be located at the same longitudinal position along the cable as far as possible.

Figure 9:
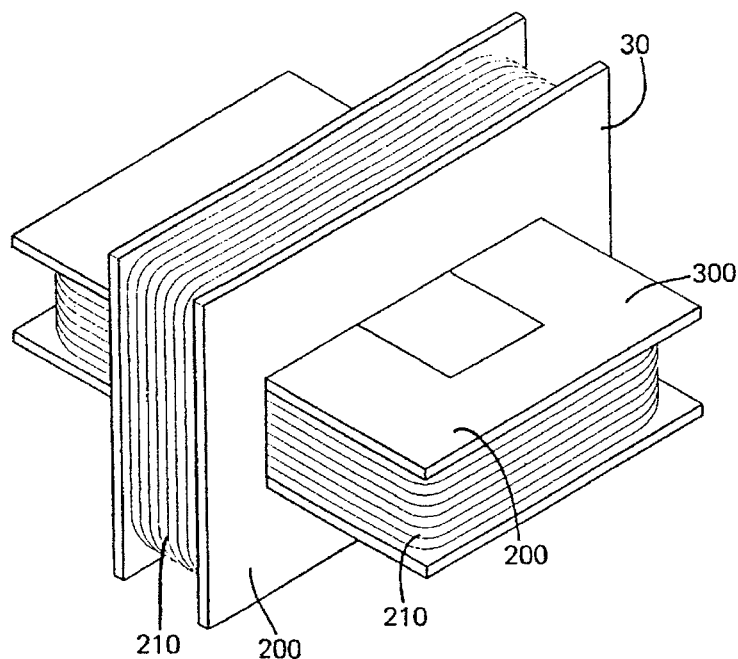
FIG. 9 shows the construction of a pair of orthogonal coils.

This is most easily accomplished, as shown in FIG. 9, by winding the coils 30 and 300 on similar hollow rectangular bobbins 200 so that the coil 300 fits in the coil 30, or vice versa. For example, we have constructed orthogonal coils as shown in FIG. 9 where each bobbin 200 has external dimensions of 12 mm×17 mm×7 mm and an aperture measuring 7 mm×12 mm so that one bobbin may be inserted endwise snugly within the aperture of the other so that the axes 32, 320 of the coils substantially intersect at the centre of the bobbins. Each coil consisted of 682 turns of 38 AWG wire 210 filling each bobbin channel which measured 6 mm×2 mm.

Of course, if the current carrying wires do not spiral along the length of the cable, one could place the coil 300 further along the cable.

As will be understood, in the case of round cables where the orientation of the current carrying wires in unknown, the arrangements shown in FIGS. 5, 6 and 7 will also need a respective additional coil, similar to the coil 300, closely associated with each of the original coils 30, 30', 34 and 34'. Each such additional coil will have substantially the same number of ampere turns as the original coil with which it is associated, and be located at substantially the same distance from the cable 20' as the associated original coil and at substantially the same angular position around the cable 20' as the associated original coil. However, its axis will be orientated in the plane normal to the cable 20' substantially orthogonally to the axis of the associated original coil (i.e. passing substantially through the centre of the cable). The additional coils will be connected in the same phase relationships as their associated original coils. Each additional coil and the original coil with which it is associated is preferably formed as an orthogonal pair as shown in FIG. 9.

The net voltage output Vx of the additional coils (which is proportional to the x component of the magnetic field) and the net voltage output Vy of the original coils (which is proportional to the y component of the magnetic field) are fed to respective substantially identical tuned amplifiers, and the outputs of the tuned amplifiers can be analog to digital converted and processed according to equation 9 to determine V which is directly proportional to the current I in the cable 20'.

FIGS. 10 to 13 illustrate an embodiment of the invention for measuring the current in a 50 Hz a.c. mains cable, based on the principles discussed above.

Figure 11:
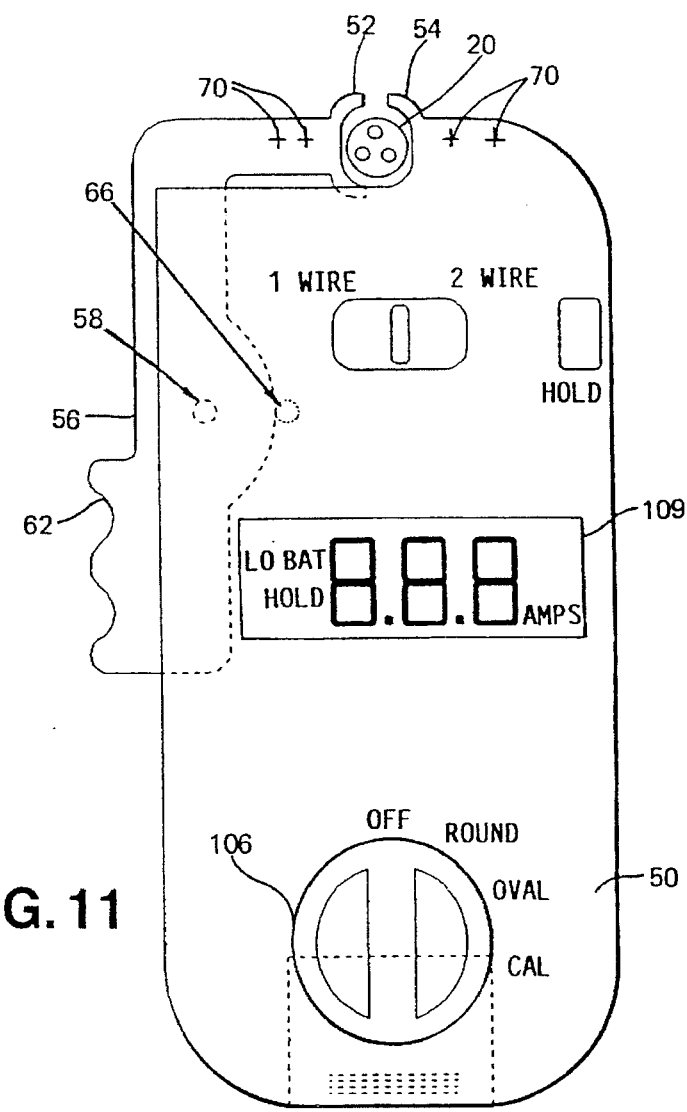
FIG. 11 shows a housing containing the circuit of FIG. 10.

A hand-held housing 50 (FIG. 11) has a pair of calliper-like jaws 52, 54 for receiving a cable (although the cable is shown as a round cable 20', the apparatus will work equally well with a flat or oval cable). The jaw 52 is formed at the upper end of a lever 56 which is pivoted at 58 to the main body of the housing 50, so that the jaw 52 is movable towards and away from the jaw 54 which is fixed to the main body of the housing. A compression spring 60 (FIG. 12) biasses the bottom end of the lever 56 in a clockwise direction (as seen in FIG. 11) so that the jaws 52, 54 tend to close. However, the jaws may be opened by squeezing the lower end of the lever 56 against the bias of the spring 60, for which purpose finger holds 62 are provided. An arcuate portion 64 of the lever 56 drives a potentiometer 66 via gears 68. Thus the setting of the potentiometer 66 is a direct measure of the degree of opening of the jaws 52, 54.

In use the lever 56 is squeezed to open the jaws 52, 54, a cable 20 or 20' is inserted between the jaws, and the lever 56 released to allow the jaws 52, 54 to automatically move together to contact the opposite sides of the periphery of the cable. Thus the setting of the potentiometer 66 gives the diameter of the cable. The inside of the jaws may be lightly serrated to prevent cable slippage.

Figure 13:
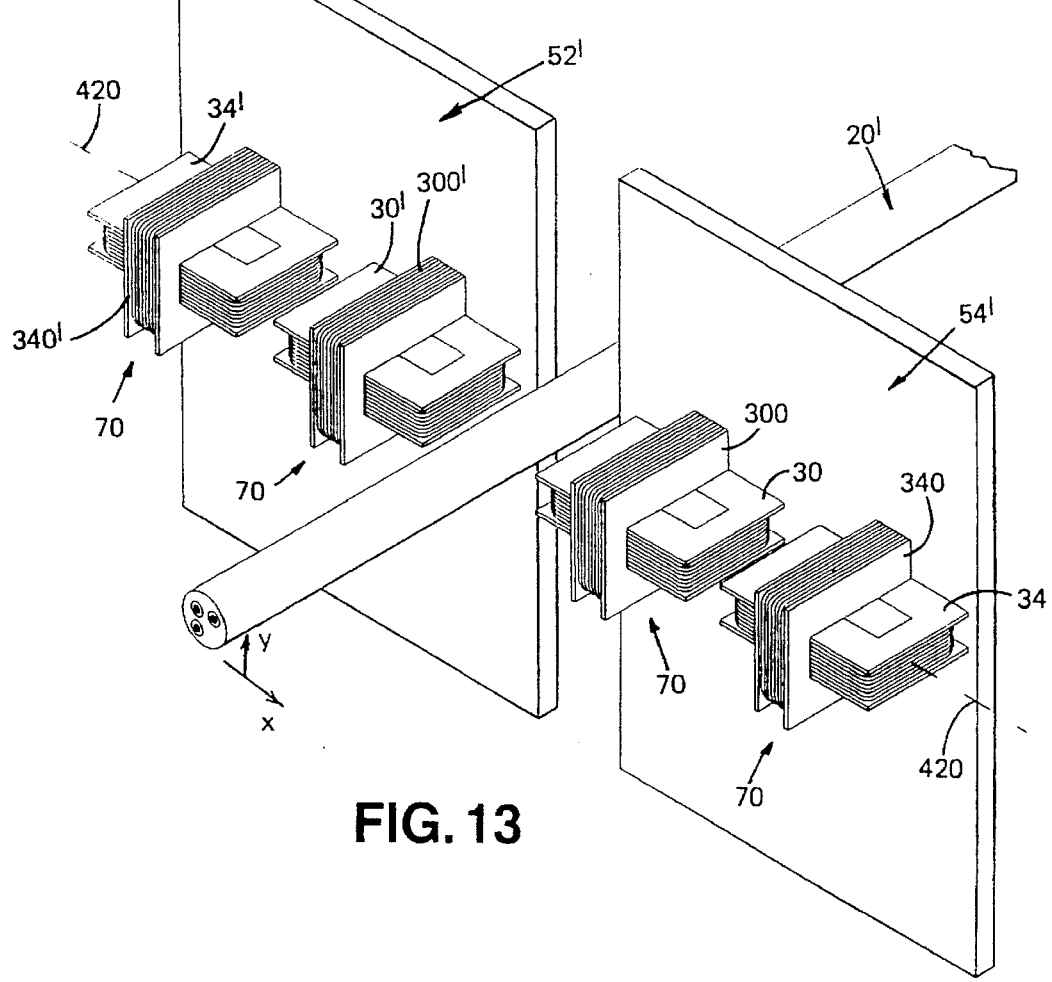
FIG. 13 is a detailed view of the arrangement of the orthogonal coils inside the jaws of the calliper of FIG. 10.

Two pairs of orthogonal coils 70 constructed as described with reference to FIG. 9 are mounted on each side of the jaws. These comprise a first set of four coils 30, 30', 34 and 34' as described in relation to FIG. 7, and a second set of four coils 300, 300', 340 and 340' each respectively forming an orthogonal pair 70 (FIG. 13) with a respective coil 30, 30', 34 and 34' of the first set. All eight coils (two in each orthogonal pair) have substantially the same number of ampere-turns. As seen in FIG. 13, the orthogonal pairs 70 all lie substantially along a common notional line 420 passing through the centre of the cable 20', and each pair 70 is of substantially identical construction. The axes of the coils 30, 30', 34 and 34' are substantially parallel, being substantially normal to the line 420 and lying in a substantially common plane normal to the cable 20'. The axes of the coils 300, 300', 340 and 340' all lie substantially along the notional line 420.

The distance from the cable contacting inner edge of the jaw 54 to the orthogonal pair 30/300 is substantially the same as the distance from the cable contacting inner edge of the jaw 52 to the orthogonal pair 30'/300'. Likewise, the distance from the cable contacting inner edge of the jaw 54 to the orthogonal pair 34/340 is substantially the same as the distance from the cable contacting inner edge of the jaw 52 to the orthogonal pair 34'/340'. It will be understood that FIG. 13 does not show the jaws 52, 54 themselves, but rather the orthogonal pairs 70 are shown mounted on printed circuit boards (PCBs) 52', 54' which are respectively mounted in the upper end of the lever 56 and in the upper end of the housing 50. The ends of the coils 300, 340, 300' and 340' are located in cut-outs in the PCBs and connections to the coils are made by flying leads. Alternatively, it is possible to build metal feet into the bobbins so that they may be directly mounted on the PCBs. In order to take advantage of the approximation afforded by equation 7, the distance between the axis of each of the coils 30 and 30' and the centre of the cable, when the latter is located between and in contact with the inner edges of the jaws 52 and 54, is preferably at least three times the distance between the current-carrying wires of the cable for the range of cable diameters for which the apparatus is designed.

The coils 30, 30', 34 and 34' are connected in series and, provided a 1 or 2 wire select switch 84 is in its 2-wire position, the coils 30 and 30' are connected in the same phase and coils 34 and 34' are also connected in the same phase but in phase opposition to the coils 30 and 30' (i.e. the coils 30, 30', 34 and 34' are connected in the manner described with reference to FIG. 7). For the moment it will be assumed that the switch 84 is in the 2 wire position. The coils 300, 300', 340 and 340' are also connected in series in the manner described with reference to FIG. 7, with coils 300 and 300' being connected in the same phase and coils 340 and 340' also connected in the same phase but in phase opposition to the coils 300 and 300'.

The net induced voltage Vx in the series-connected coils 300, 300', 340 and 340' (representing the x component of the magnetic field generated by the current I in the cable 20') is supplied to a first analog hybrid circuit 80, and the net induced voltage Vy in the series-connected coils 30, 30', 34 and 34' (representing the y component of the magnetic field) is supplied to a second substantially identical analog hybrid circuit 82.

In each circuit 80 and 82 the voltage signal is first passed through a respective programmable gain stage 86. These stages 86 are under the control of a microcontroller 88 via signals from the microcontroller input/output ports 89 and have eight different settings, although for any given measurement the same gain is set for the stages 86 in each circuit 80, 82. In some circumstances the voltages from the coils could saturate the following processing circuitry, and the stages 86 allow the voltage to be brought within acceptable limits.

Next each voltage signal passes through two bandpass filter stages 90, 92 connected in series and each providing a 50 Hz bandpass filter and 35 dB of gain. Next the signal passes through a full-wave rectifier 94 which rectifies the amplified 50 hz signal and finally a low pass filter 96 which converts the full wave rectified signal to a DC signal with two stages of filters. The analog output signal from each circuit 80, 82 is a DC voltage which is proportional to the magnetic field component (Hx or Hy) detected by the corresponding set of coils. These DC signals are then fed into the A to D inputs 98, 100 of the microcontroller 88.

Another A to D input 102 of the microcontroller 88 also receives an analog voltage from a cable diameter measuring circuit 104 which is essentially a simple circuit for convening the resistance setting of the potentiometer 66 to a corresponding voltage. The magnitude of this voltage is therefore a signal identifying to the microcontroller 88 the diameter of the cable 20'.

Finally, the microcontroller 88 also receives an input from a control switch 106. This can be manually set to any selected one of a plurality of positions, for example Oval Wire Twin, Oval Wire T&E, Round Wire Twin or Round Wire T&E, respectively corresponding to different standard cable types. The selected position indicates to the microprocessor the particular type of cable which is under measurement.

Software stored in the program memory 108 of the microcontroller 88 performs the calculation according to equation 8 to determine the voltage V which is proportional to the magnitude |H| of the magnetic field generated by the cable 20'. By substitution in equation 7 and re-arrangement:

$$I = k(V r^2/d) \quad (9)$$

where k is a calibration constant determined by the coil parameters and the gain of the circuits 80 and 82.

Since the coils are fixed in position relative to the jaws 52, 54 the distance r is determined by the diameter d of the cable. Thus all that the microprocessor 88 needs to know in order to calculate the current I in the cable is the distance d between the current carrying wires 16, 18. This it can deduce in response to the signal from the control switch 106 in combination with the voltage signal corresponding to the setting of the potentiometer 66. The former gives the cable type, e.g. Round or Oval Twin or T&E, and the latter gives the diameter of the cable. As mentioned before, these two uniquely determine the distance d for a large range of different standard cable sizes and types.

Thus the microprocessor 88 has all the information it needs to calculate the current; this simple calculation is performed in the software in the program memory 108 and the result is displayed on a liquid crystal or other display screen 109 driven by the microcontroller 88 via a display driver 110.

The knob of the control switch 106 is removable and when it is a calibration switch position is exposed. This position may be accessed by using a screwdriver or pliers to turn the switch. The apparatus is calibrated automatically by placing the main control switch in the calibration position and following the display prompts. To avoid the use of calibration potentiometers and their inherent problems all calibration constants are kept in a non-volatile EEPROM 112.

In the case of oval wires, the apparatus is preferably calibrated for the oval wire having its major axis vertically between the jaws 52, 54 (as seen in FIG. 11) since a more secure grip is obtained. However, it could be calibrated for the oval wire having its minor axis vertically between the jaws.

A single PP3 battery (not shown) is used to power the apparatus.

Returning now to the 1 or 2 wire select switch 84, the preceding description assumed that the switch 84 was in the 2-wire position, so that the coils 30 and 30' are connected in the same phase and the coils 34 and 34' are also connected in the same phase but connected in phase opposition to the coils 30 and 30', as described for FIG. 7. This enabled the apparatus to measure the current in cables having two current carrying wires, as described.

However, it is also desirable that the apparatus be capable of measuring the current flowing in cables with only a single current carrying wire. In such a case the magnetic field on diametrically opposite sides of the cable is equal but in opposite directions, as compared to the case shown in FIG. 2 where on the axis 22 the magnetic field is in the same direction on each side of the cable. Therefore, with the coils 30, 30', 34 and 34' connected in the manner of FIG. 7 the voltage induced in the coils 30 and 34 would cancel the voltage induced in the coils 30' and 34' and no measurement could be made.

Therefore, to allow a measurement to be made for single wire cables, the switch 84 can be switched over to the 1-wire position wherein the coils 30 and 34' are connected in the same phase and the coils 30' and 34 are also connected in the same phase but in phase opposition to the coils 30 and 34' (the switch 84 may be a simple cross-over switch). In this case the output of the coils 30, 30', 34 and 34' is (using the symbology of FIG. 7) equal to [(V1−V2)−(V1'−V2')]. However, since V1=−V1' and V2=−V2' (because of the oppositely directed magnetic fields on each side of the cable) this reduces to [2|V1|−2|V2|] which is proportional to the current I in the cable. This is processed by the circuit 82 and microprocessor in the manner described to give a reading of the current I on the display 109. It will be noted that in the 1-wire measurement the output of the coils 300, 300', 340 and 340' is substantially zero as there is no component of the magnetic field passing through those coils.

Various modifications of the above apparatus are possible. For example, if it were desired that the apparatus only measure the current flowing in oval cables, the orientation of the current carrying wires would be known and one could dispense with the coil set 300, 340, 300' and 340' (which would be equivalent to FIG. 7) or the coil set 30, 34, 30' and 34' according to whether the oval cable were orientated with its major or minor axis along the notional line 420 (FIG. 13). Of course, if one were measuring only oval cables, one could omit the control switch 106. Also, if the effect of interfering cables could be ignored, the coils 34, 340, 34' and 340' could be omitted. Finally, if desired the coils on one side of the cable could be omitted altogether, for example the coils 30', 300', 34' and 340', since they simply double the sensitivity of the apparatus and do not contain information which is not obtainable from the remaining coils.

Mechanical modifications to the apparatus are also possible. For example, FIGS. 14 and 15 show a further embodiment of the invention which uses a housing 150 which is an alternative to the housing 50 shown in FIG. 11.

Figure 14:
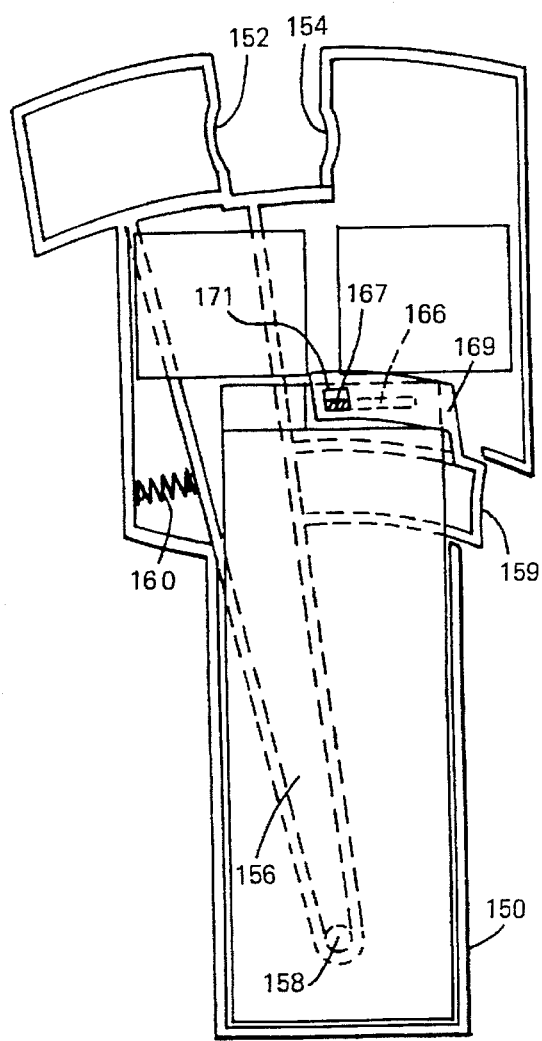
FIG. 14 is a side view, partially in cross-section, of an alternative housing to that shown in FIG. 11 with the jaws open.
Figure 15:
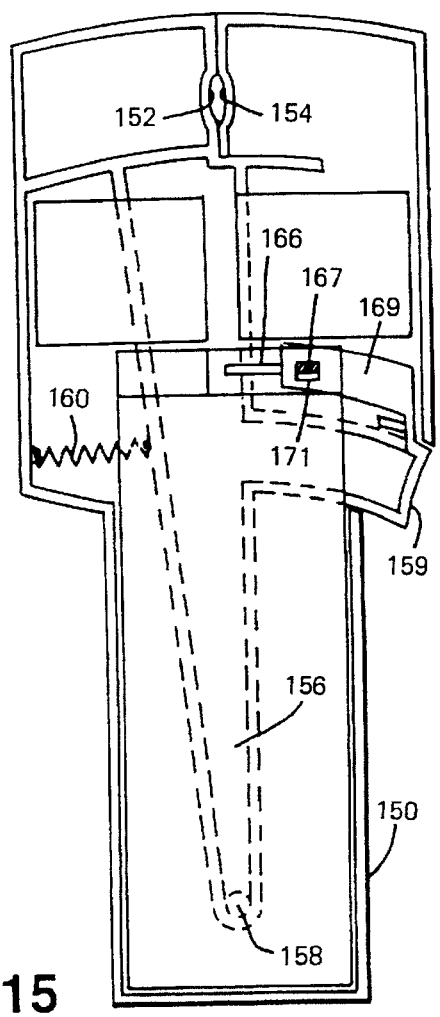
FIG. 15 is a side view, partially in cross-section, of the housing of FIG. 12 with the jaws closed.

In FIGS. 14 and 15 the hand-held housing 150 again has a pair of calliper-like jaws 152, 154 for receiving a cable. The jaw 152 is formed at the upper end of an arm 156 which is pivoted at 158 to the main body of the housing 150 so that the jaw 152 is movable towards and away from the jaw 154 which is fixed to the main body of the housing. A compression spring 160 between the main body of the housing 150 and the arm 156 biasses the arm 156 in a clockwise direction (as seen in FIGS. 14 and 15) so that the jaws 152, 154 tend to close (FIG. 15). However, the jaws may be opened by pushing on a thumb operated trigger 159 integral with the arm 156 against the bias of the spring 160.

A linear potentiometer 166 is fixed in the main body of the housing 150, the potentiometer having a slider 167. A flat plate 169 integral with the trigger 159 extends alongside the potentiometer 166, and the slider 167 projects into an aperture 171 in the plate 169. Thus movement of the trigger 159, and hence of the arm 156, moves the slider 167 along the potentiometer 166. Since the trigger 159 moves along a slightly arcuate path whereas the slider 167 moves along a linear path the aperture 171 is slightly larger than the slider 167 in the radial direction relative to the pivot point 158 to allow relative radial movement between the slider 167 and the plate 171 during movement of the trigger. Thus the setting of the potentiometer 166 is a direct measure of the degree of opening of the jaws 152, 154.

In use the trigger 159 is pushed into the main body of the housing 150 to open the jaws 152, 154, a cable 20 or 20' is inserted between the jaws, and the trigger released to allow the jaws 152, 154 to automatically move together to contact the opposite sides of the periphery of the cable. Thus the setting of the potentiometer 166 gives the diameter of the cable. The inside of the jaws may be lightly serrated to prevent cable slippage.

Figure 10:
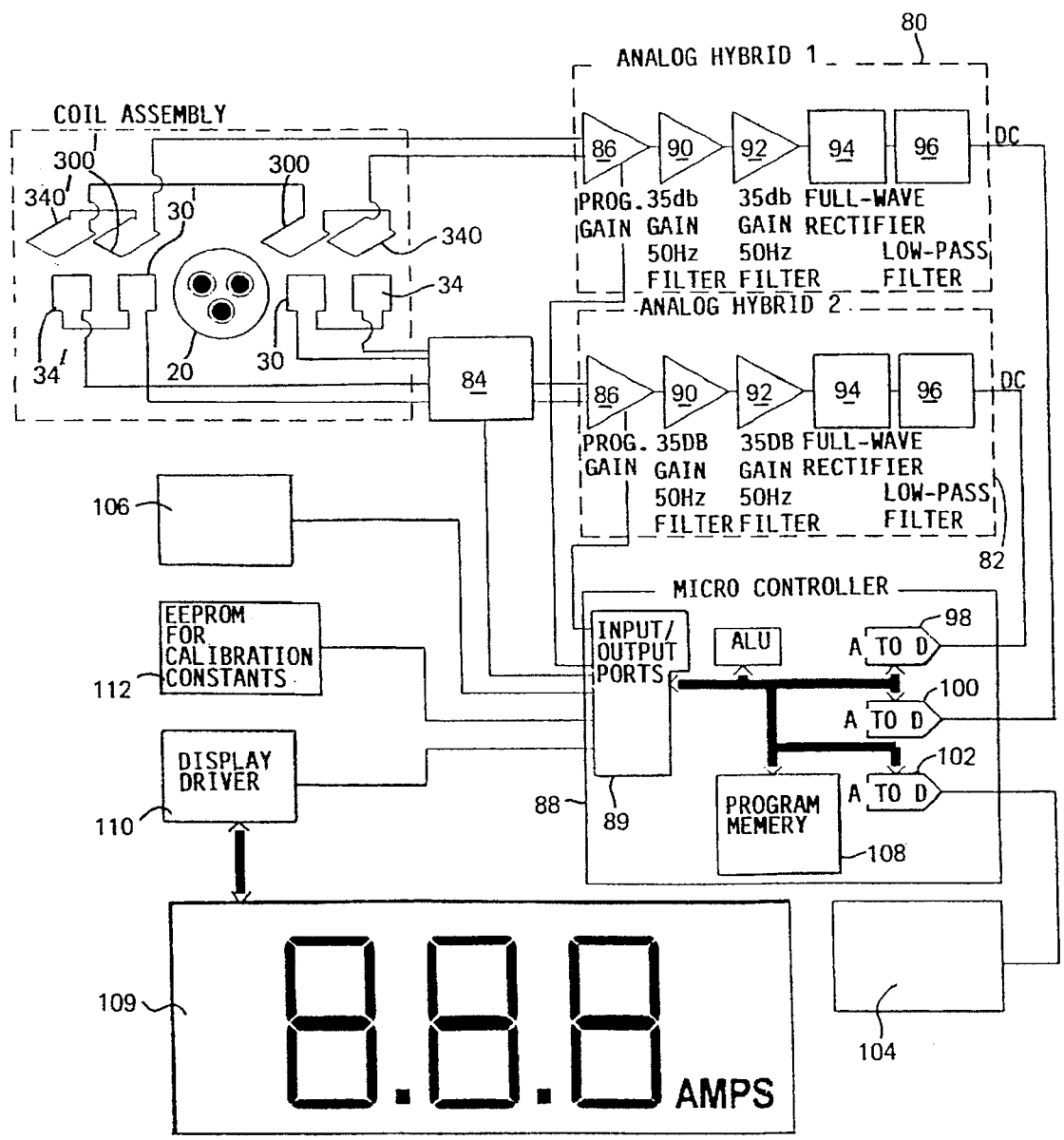
FIG. 10 is a block circuit diagram of an embodiment of the invention for measuring the current in an a.c. mains cable.
Figure 12:
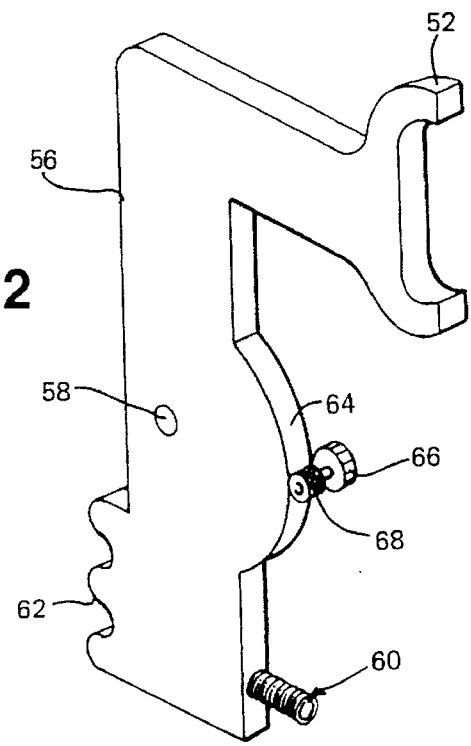
FIG. 12 shows details of the spring-biassed calliper of FIG. 11.

Apart from the mechanical construction of the housing 150 and the use of a sliding potentiomenter 166, the arrangement of the coils and the construction and functioning of the electronic processing and display circuitry of the embodiment of FIGS. 14 and 15 may be the same as already described in relation to FIGS. 10 and 13. Thus these details are not repeated here.

In a variation, not shown, of the embodiment of FIGS. 14 and 15, the arm 156 is opened and closed by a thumb operated slider mounted on the main body of the housing 150. In this embodiment the sliding movement of the slider operates through a cam to causes opening and closing of the jaws 152, 154. In other embodiment, also not shown, instead of the jaws 52, 54 being rotatable one towards the other they could be slidable one towards the other in the manner of micrometer jaws.

We claim:

1. An apparatus for measuring an a.c. current flowing in an electric cable, the apparatus comprising cable receiving means having relatively movable cable contacting elements which are adjustable to engage the periphery of the cable, means for generating a cable size signal corresponding to the relative positions of the cable contacting elements, at least one coil to detect the magnetic field generated by current flowing in the cable, and circuit means responsive to the cable size signal and the voltage induced in the coil for determining the amplitude of the current flowing in the cable.

2. An apparatus as claimed in claim 1, wherein the cable receiving means has two opposing cable contacting elements which are adjustable towards and away from one another to engage opposite sides of the cable periphery.

3. An apparatus as claimed in claim 2, wherein the opposing cable contacting elements are spring biassed one towards the other so that when a cable is placed in the cable receiving means the two cable contacting elements automatically move to engage the cable.

4. An apparatus as claimed in claim 1, wherein the means for generating the cable size signal comprises a potentiometer which is driven by movement of the cable receiving means.

5. An apparatus as claimed in claim 1, further including manually settable multi-position input means for indicating any one of a number of standard cable types, the circuit means further being responsive to the said indication for determining the amplitude of the current(s) flowing in the cable.

6. An apparatus as claimed in claim 1, wherein a second coil is provided on the opposite side of the first coil to the cable receiving means, the first and second coils having substantially parallel axes, and wherein the circuit means is responsive to the difference between the voltages induced in the first and second coils.

7. An apparatus as claimed in claim 6, wherein the first and second coils have substantially the same number of ampere turns and are connected in series in phase opposition and the circuit means is responsive to the output voltage of the series-connected first and second coils.

8. An apparatus as claimed in claim 6, further including third and fourth coils located close to the first and second coils respectively, the first and third coils having substantially orthogonal axes and the second and fourth coils having substantially orthogonal axes, and wherein the circuit means is further responsive to the difference between the voltages induced in the third and fourth coils.

9. An apparatus as claimed in claim 8, wherein the first and second coils have substantially the same number of ampere turns and are connected in series in phase opposition, wherein the third and fourth coils have substantially the same number of ampere turns and are connected in series in phase opposition, and wherein the circuit means is responsive to the output voltage of the series-connected first and second coils and to the output voltage of the series-connected third and fourth coils.

10. An apparatus as claimed in claim 8, wherein the first and third coils are disposed one within the other and the second and fourth coils are disposed one within the other.

11. An apparatus as claimed in claim 1, also including a further coil located close to the first coil, the first and further coils having substantially orthogonal axes, and wherein the circuit means is further responsive to the voltage induced in the further coil.

12. An apparatus as claimed in claim 11, wherein the first and further coils are disposed one within the other.

13. A method for measuring an a.c. current flowing in an electric cable having two wires carrying go and return currents of nominally equal amplitude, comprising locating first and second coils close together adjacent the cable, the first and second coils having substantially orthogonal axes, generating a code size signal and determining the amplitude of the current flowing in the cable from the voltages induced in the first and second coils.

14. A method as claimed in claim 13, wherein the first and second coils are disposed one within the other so that their axes substantially intersect.

15. A method as claimed in claim 13, wherein the distance between the axis of the first coil and the centre of the cable is at least three times the distance between the two current-carrying wires.

16. A method for measuring an a.c. current flowing in an electric cable having two wires carrying go and return currents of nominally equal amplitude, comprising locating a first coil adjacent the cable, locating a second coil adjacent the first coil on the opposite side of the first coil to the cable, the first and second coils having substantially parallel axes, generating a cable size signal forming a difference signal related to the difference between the voltages induced in the first and second coils, and determining the amplitude of the current flowing in the cable from the difference signal.

* * * * *